(12) United States Patent
Long (10) Patent No.: US 12,166,133 B2
(45) Date of Patent: Dec. 10, 2024

(54) SEMICONDUCTOR STRUCTURE AND A MANUFACTURING METHOD THEREOF

(71) Applicant: CHANGXIN MEMORY TECHNOLOGIES, INC., Hefei (CN)

(72) Inventor: Qiang Long, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 401 days.

(21) Appl. No.: 17/456,591

(22) Filed: Nov. 25, 2021

(65) Prior Publication Data

US 2022/0165886 A1     May 26, 2022

Related U.S. Application Data

(63) Continuation of application No. PCT/CN2021/107373, filed on Jul. 20, 2021.

(30) Foreign Application Priority Data

Nov. 23, 2020   (CN) .......................... 202011324586.9

(51) Int. Cl.
*H01L 29/786* (2006.01)
*H01L 21/02* (2006.01)
(Continued)

(52) U.S. Cl.
CPC .. *H01L 29/78672* (2013.01); *H01L 21/02595* (2013.01); *H01L 21/28568* (2013.01);
(Continued)

(58) Field of Classification Search
CPC ............. H01L 29/4925; H01L 29/4941; H01L 29/78672; H01L 29/6675; H01L 21/02595;
(Continued)

(56) References Cited

U.S. PATENT DOCUMENTS

| | | | | |
|---|---|---|---|---|
| 5,817,547 A | * | 10/1998 | Eom | ................... H01L 29/4933 257/E29.155 |
| 2002/0004294 A1 | * | 1/2002 | Gardner | .............. H01L 29/4925 438/560 |
| 2004/0021161 A1 | * | 2/2004 | Agarwal | .............. H10B 12/488 257/E21.654 |
| 2004/0266151 A1 | | 12/2004 | Lim et al. | |

(Continued)

FOREIGN PATENT DOCUMENTS

| CN | 1574398 A | 2/2005 |
|---|---|---|
| CN | 102903638 B | 3/2016 |

(Continued)

OTHER PUBLICATIONS

International Search Report (ISR) in Application No. PCT/CN2021/107373, mailed on Oct. 18, 2021.

*Primary Examiner* — Alia Sabur
(74) *Attorney, Agent, or Firm* — Syncoda LLC; Feng Ma (57) ABSTRACT

A semiconductor structure includes: a substrate; a gate structure located on the substrate, wherein the gate structure comprises a first conductive layer, a barrier layer and a second conductive layer which are stacked in sequence; wherein the first conductive layer includes a first polysilicon layer, a first metal layer and a second polysilicon layer, wherein the first polysilicon layer is adjacent to the substrate and the second polysilicon layer is contiguous to the barrier layer; and wherein the first metal layer is located between the first polysilicon layer and the second polysilicon layer. The gate structure of the embodiments of the application has a straight profile and an excellent electrical performance.

17 Claims, 4 Drawing Sheets

(51) Int. Cl.
*H01L 21/285* (2006.01)
*H01L 21/3213* (2006.01)
*H01L 21/3215* (2006.01)
*H01L 29/49* (2006.01)
*H01L 29/66* (2006.01)

(52) U.S. Cl.
CPC .. *H01L 21/32132* (2013.01); *H01L 21/32139* (2013.01); *H01L 21/32155* (2013.01); *H01L 29/4925* (2013.01); *H01L 29/4941* (2013.01); *H01L 29/6675* (2013.01)

(58) Field of Classification Search
CPC ......... H01L 21/78672; H01L 21/28061; H01L 21/28123
See application file for complete search history.

(56) References Cited

U.S. PATENT DOCUMENTS

| | | | |
|---|---|---|---|
| 2005/0260859 A1* | 11/2005 | Deshpande | H01L 29/4925 438/719 |
| 2014/0015030 A1* | 1/2014 | Han | H01L 29/7881 257/316 |
| 2014/0030884 A1* | 1/2014 | Rouh | H01L 21/32139 438/653 |
| 2015/0318287 A1* | 11/2015 | Sugino | H01L 23/53261 257/296 |
| 2019/0131301 A1 | 5/2019 | Lee et al. | |

FOREIGN PATENT DOCUMENTS

| | | | |
|---|---|---|---|
| CN | 107437501 A | | 12/2017 |
| KR | 20070096495 A | * | 10/2007 |

* cited by examiner

SEMICONDUCTOR STRUCTURE AND A MANUFACTURING METHOD THEREOF

CROSS-REFERENCE TO RELATED APPLICATIONS

This is a continuation of International Patent Application No. PCT/CN2021/107373 filed on Jul. 20, 2021, which claims priority to Chinese Patent Application No. 202011324586.9 filed on Nov. 23, 2020. The disclosures of the above-referenced applications are incorporated herein by reference in their entirety.

BACKGROUND

As a variable current switch, the field effect transistor in a semiconductor structure can control the output current based on the input voltage. The field effect transistor comprises three terminals: a gate, a drain and a source. Under the action of the electric field, the gate may form or eliminate the channel between the source and drain, thereby allowing or blocking the flow of electrons.

SUMMARY

The present disclosure relates to the semiconductor field, and more specifically to a semiconductor structure and a manufacturing method thereof.

Various embodiments of the present disclosure provide a semiconductor structure and a manufacturing method thereof to improve the electrical performance of the gate structure, thereby ensuring the yield of the semiconductor structure.

Some embodiment of the present disclosure provide a semiconductor structure including: a substrate; a gate structure located on the substrate, wherein the gate structure comprises a first conductive layer, a barrier layer and a second conductive layer which are stacked in sequence; wherein, the first conductive layer comprises a first polysilicon layer, a first metal layer and a second polysilicon layer, wherein the first polysilicon layer is adjacent to the substrate and the second polysilicon layer is contiguous to the barrier layer; and the first metal layer is located between the first polysilicon layer and the second polysilicon layer.

The embodiment of the application also provides a manufacturing method of the semiconductor structure, which comprises: providing a substrate; sequentially forming an initial first conductive layer, an initial barrier layer and an initial second conductive layer on the substrate, wherein the initial first conductive layer, the initial barrier layer and the initial second conductive layer constitute the initial gate structure; the initial first conductive layer comprising an initial first polysilicon layer, an initial first metal layer, and an initial second polysilicon layer, wherein the initial first polysilicon layer is adjacent to the substrate and the initial second polysilicon layer is contiguous to the initial barrier layer; the initial first metal layer located between the initial first polysilicon layer and the initial second polysilicon layer; forming a patterned mask layer on the initial gate structure; etching the initial first conductive layer, the initial barrier layer and the initial second conductive layer with the patterned mask layer as a mask to form a first conductive layer, a barrier layer and a second conductive layer; the first conductive layer, the barrier layer and the second conductive layer constituting a gate structure; and the first conductive layer comprising a first polysilicon layer, a second polysilicon layer and a first metal layer.

BRIEF DESCRIPTION OF THE DRAWINGS

One or more embodiments are illustrated by way of example with reference to the accompanying drawings, which are not to be limiting to the embodiments, and the elements having the same reference numeral designation in the drawings are represented as similar elements. The figures in the drawings are not to be limiting to scale unless specifically stated.

DETAILED DESCRIPTION

Most field effect transistors use a polysilicon material and other conductive materials to form a gate structure. Using a polysilicon material to form the gate structure has the following advantages: there are fewer defects at the interface between the polysilicon and the gate dielectric layer; the work function of the polysilicon is easy to modulate, and in turn the threshold voltage of the field effect transistor is easy to modulate; and the polysilicon has a higher melting point than most metals and the gate material is often deposited at high temperatures in the semiconductor process to improve the device performance, so the polysilicon does not affect the upper temperature limit that can be applied in the process.

However, during the formation of the polysilicon gate structure, the sides of the polysilicon are prone to be over-etched in the etching process due to the features of the polysilicon material and the limitations of the etching process, which in turn affects the electrical performance of the gate structure and reduces the yield of the semiconductor structure.

That is, during the formation of a polysilicon gate structure, the sides of polysilicon are prone to be over-etched in the etching process due to the features of the polysilicon material and the limitations of the etching process, which in turn affects the electrical performance of the gate structure and reduces the yield of the semiconductor device.

Figure 1:
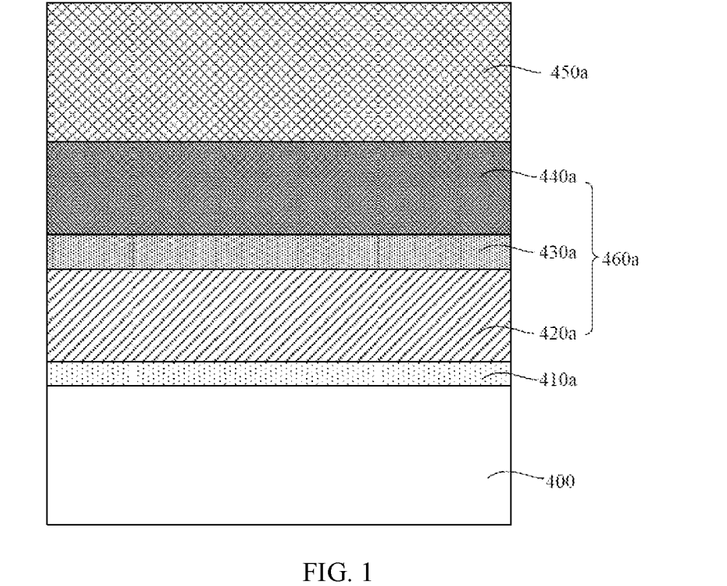
FIG. 1 is a schematic illustration of a semiconductor structure.
Figure 2:
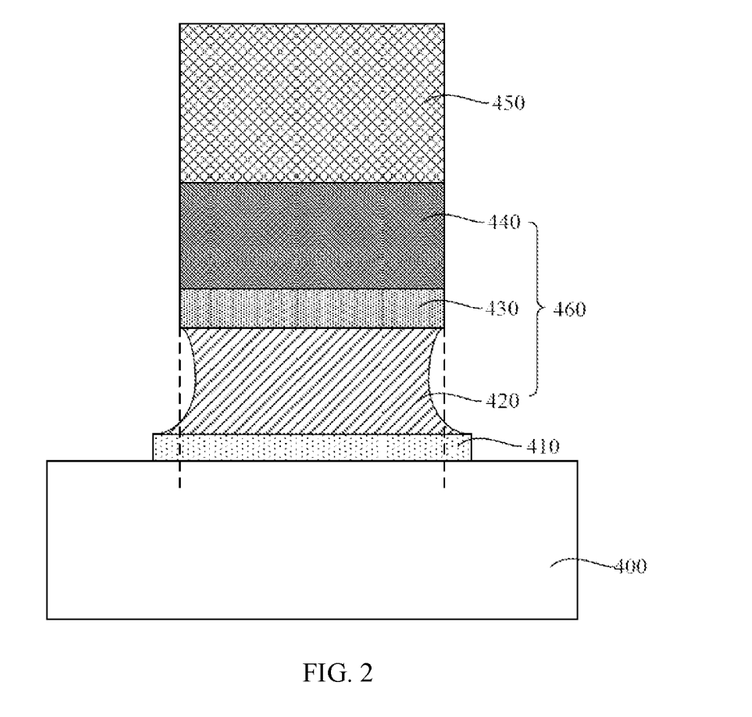
FIG. 2 is a schematic illustration of the semiconductor structure of FIG. 1 after etching.

FIG. 1 is a schematic illustration of a semiconductor structure before etching, and FIG. 2 is a schematic illustration of the semiconductor structure in FIG. 1 after etching.

The steps of forming the semiconductor structure comprise: referring to FIGS. 1 and 2, providing a substrate 400 on which an initial gate dielectric layer 410a, an initial first conductive layer 420a, an initial barrier layer 430a, an initial second conductive layer 440a, and an initial insulating cap layer 450a are sequentially stacked, wherein the initial first conductive layer 420a, the initial barrier layer 430a, and the initial second conductive layer 440a constitute an initial gate structure 460a; and forming a gate dielectric layer 410, a first conductive layer 420, a barrier layer 430, a second conductive layer 440, and an insulating cap layer 450 after etching the initial gate dielectric layer 410a, the initial first conductive layer 420a, the initial barrier layer 430a, the initial second conductive layer 440a, and the initial insulating cap layer 450a.

The first conductive layer 420, the barrier layer 430 and the second conductive layer 440 constitute a gate structure 460. Due to the features of the material and the limitations of the etching process, the first conductive layer 420 has the problems of necking and footing, which in turn affects the electrical performance of the gate structure 460 and the process window of the subsequent source-drain ion implantation in the substrate 400, thereby affecting the yield of the semiconductor device.

It is found that the main reasons for the above problems comprise: the initial first conductive layer 420a is a polysilicon layer, and the current etching process for a polysilicon layer is mainly dry etching method; a portion of etching gas still erodes the sides of a polysilicon layer despite the anisotropic characteristics of dry etching method; a larger thickness of a polysilicon layer creates a larger contact area between the sides of the polysilicon and the etching gas, and causes a longer etching time and an increased degree of etching gas erosion in the sides of the polysilicon; and additionally, the uneven distribution of the etching gas creates under-etching of the bottom of a polysilicon layer, thereby causing the problem of footing.

To solve the above problems, the embodiments of the application provide a semiconductor structure, wherein the first conductive layer comprises a first polysilicon layer, a second polysilicon layer and a first metal layer, wherein the first polysilicon layer is adjacent to the substrate, the second polysilicon layer is contiguous to the barrier layer and the first metal layer is located between the first polysilicon layer and the second polysilicon layer; with the total thickness of the first conductive layer controlled, the thickness of each polysilicon layer is reduced as the number of polysilicon layers is increased, wherein the contact area between the sides of a polysilicon layer and the etching gas is reduced and the etching time of the sides of a polysilicon layer is shortened; additionally, as the polysilicon layer is thin, the etching gas is distributed uniformly on the sides of a polysilicon layer, which causes the etching gas to better etch the bottom of a polysilicon layer and eases the problem of footing; therefore, a straight profile will be ultimately guaranteed for the sides of a polysilicon layer, thereby improving the electrical performance of the gate structure; and additionally, prior to the subsequent source-drain ion implantation to the substrate, sidewalls are usually formed on both sides of the gate structure, wherein the sidewalls are used as mask layers in ion implantation to form the Lightly Doped Drain (LDD) structure. Accordingly, the straight profile of the sides of the gate structure will not affect the process window of the subsequent etching process.

In order to further clarify the purpose, technical schemes and advantages of the embodiments of the present disclosure, the embodiments of the present disclosure will be described in detail with reference to the accompanying drawings. However, one of ordinary skill in the art will appreciate that in various embodiments of the present disclosure a plurality of technical details have been presented for readers to better understand this application. However, even without these technical details and various changes and modifications based on the following embodiments, the technical schemes claimed herein may be realized.

Figure 3:
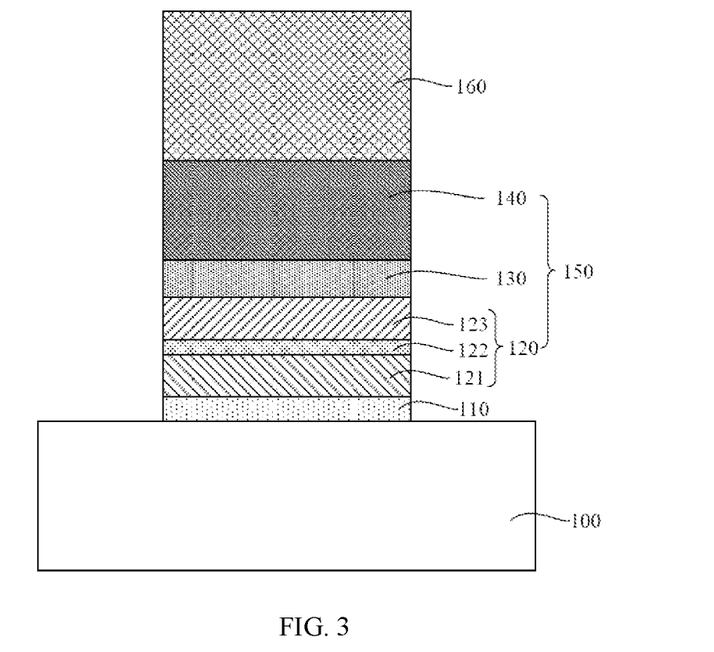
FIG. 3 is a schematic illustration of the semiconductor structure provided by the first embodiment of the present disclosure.

The first embodiment of the present disclosure provides a semiconductor structure, and FIG. 3 is a schematic cross-sectional view of the semiconductor structure provided thereby. The semiconductor structure provided by the embodiment will be described in detail below with reference to the accompanying drawings.

Referring to FIG. 3, in some embodiments, the semiconductor structure comprises: a substrate 100; a gate structure 150 on the substrate 100, wherein the gate structure 150 comprises a first conductive layer 120, a barrier layer 130, and a second conductive layer 140 which are sequentially stacked; and the first conductive layer 120 comprising a first polysilicon layer 121, a first metal layer 122, and a second polysilicon layer 123, wherein the first polysilicon layer 121 is adjacent to the substrate 100 and the second polysilicon layer 123 is contiguous to the barrier layer 130.

The material of the substrate 100 is a semiconductor. In the exemplary embodiment, the material of the substrate 100 is a P-type semiconductor which may be, for example, boron-doped silicon, whereas the source and the drain within the substrate 100 utilize an N-type semiconductor which may be, for example, phosphorus-doped silicon or gallium-doped silicon. In other exemplary embodiments, the substrate may also utilize an N-type semiconductor, whereas the source and the drain within the substrate utilize a P-type semiconductor.

A gate dielectric layer 110 is located between the gate structure 150 and the substrate 100. In the exemplary embodiment, the material of the gate dielectric layer 110 comprises a high dielectric constant material, which can strengthen the control ability of the gate structure 150. In other exemplary embodiments, the material of the gate dielectric layer may also be silicon oxide.

The gate dielectric layer 110 has a thickness of 2 nm to 6 nm, which specifically may be 3 nm, 4 nm, or 5 nm. If the gate dielectric layer 110 has an excessively small thickness, the problem of a leakage current is prone to occur; and if the gate dielectric layer 110 has an excessively large thickness, the threshold voltage of the gate structure 150 may be increased, which in turn affects the electrical performance of the gate structure 150. With its thickness in the range of 2 nm to 6 nm, the gate dielectric layer 110 can avoid the above two problems.

The gate structure 150 is located on the substrate 100 and is the control terminal of the field effect transistor. When a voltage is applied to the gate structure 150, an electric field directed by the gate structure 150 to the substrate 100 will be generated in the gate dielectric layer 110 between the gate structure 150 and the substrate 100; and the gate dielectric layer 110 is equivalent to a capacitor, wherein under the influence of an electric field, the electrons in the substrate 100 converge toward the gate dielectric layer 110 to form a conductive channel between the source and the drain.

The gate structure 150 comprises a first conductive layer 120, a barrier layer 130, and a second conductive layer 140 which are stacked in sequence, and the structure of the gate structure 150 will be described in detail below:

The first conductive layer 120 comprises a first polysilicon layer 121, a second polysilicon layer 123, and a first metal layer 122 located between the first polysilicon layer 121 and the second polysilicon layer 123. Accordingly, with the overall thickness of the first conductive layer 120 controlled, the thickness of each polysilicon layer is reduced as the number of polysilicon layers is increased, wherein the contact area between the etching gas and the sides of a polysilicon layer is reduced and the etching time of the sides of a polysilicon layer is shortened.

The first conductive layer 120 has a total thickness of 23 nm to 50 nm, which specifically may be 30 nm, 38 nm, or 46 nm.

P-type ions or N-type ions are doped in the first polysilicon layer 121 and the second polysilicon layer 123, and the doped ions may be phosphorus ions, boron ions, gallium ions or the like. By doping a polysilicon layer with doping P-type ions or N-type ions, the polysilicon layer can be converted into a conductor, and the work function of the polysilicon layer can be modulated by adjusting the concentration of doped ions.

In some embodiments, the concentration of doped ions in the first polysilicon layer 121 is different from that of doped ions in the second polysilicon layer 123. Therefore, the work function of the entire first conductive layer 120 can be modulated more flexibly. In other exemplary embodiments, the concentration of doped ions in the first polysilicon layer and the second polysilicon layer may be the same.

In some embodiments, the first polysilicon layer 121 and the second polysilicon layer 123 have the same thickness. With the overall thickness of the first conductive layer 120 controlled, equalizing the thickness for the two polysilicon layers can ensure that the thickness of each polysilicon layer is reduced at the same degree, thereby ensuring a relatively straight profile for the sides of each polysilicon layer.

In some embodiments, the first polysilicon layer 121 and the second polysilicon layer 123 has a thickness of 9 nm to 15 nm, which specifically may be 10 nm, 12 nm or 14 nm.

The first metal layer 122 can separate the first polysilicon layer 121 from the second polysilicon layer 123. In other words, the thickness of each polysilicon layer can be reduced without changing the total thickness of the polysilicon layers.

The first metal layer 122 has a thickness of 0.5 nm to 1.5 nm, which specifically may be 0.8 nm, 1.0 nm, or 1.2 nm. If the first metal layer 122 has an excessively small thickness, its ability to separate the polysilicon layers is weakened; and if the first metal layer 122 has an excessively large thickness, the threshold voltage of the gate structure 150 may be largely affected, and it is not easy for the gate structure 150 to have the desired electrical performance by changing the concentration of doped ions in the first polysilicon layer 121 and the second polysilicon layer 123. By keeping the thickness of the first metal layer 122 between 0.5 nm and 1.5 nm, the above two problems can be avoided.

The material of the first metal layer 122 comprises titanium nitride, tantalum nitride, or titanium, which have a low resistance and can reduce the total resistance of the gate structure 150.

The barrier layer 130 is located on the first conductive layer 120 and is contiguous to the second polysilicon layer 123. The barrier layer 130 can prevent the material in the second conductive layer 140 from diffusing into the second polysilicon layer 123, thereby improving the stability of the gate structure 150.

In some embodiments, the material of barrier layer 130 is titanium nitride. In other exemplary embodiments, the material of the barrier layer may also be tantalum nitride.

The barrier layer 130 has a thickness of 5 nm to 10 nm, which specifically may be 6 nm, 8 nm or 9 nm.

The second conductive layer 140 is located on the barrier layer 130 and is contiguous to the barrier layer 130. The second conductive layer 140 has a lower resistance and can increase the operating rate of the field effect transistor. The material of the second conductive layer comprises tungsten, gold, silver or titanium.

The second conductive layer 140 has a thickness of 20 nm to 40 nm, which specifically may be 23 nm, 30 nm, or 35 nm.

Some embodiments also comprise an insulating cap layer 160 located on the gate structure 150. Specifically, the insulating cap layer 160 is located on the second conductive layer 140 and is contiguous to the second conductive layer 140. The insulating cap layer 160 can isolate the gate structure 150 from other structures, and also can protect the gate structure 150 from oxidation.

The material of the insulating cap layer 160 comprises silicon nitride, silicon carbonitride or silicon oxide.

The insulating cap layer 160 has a thickness of 50 nm to 150 nm, which specifically may be 60 nm, 70 nm, or 120 nm.

To sum up, in the present embodiment, the first conductive layer 120 comprises a first polysilicon layer 121, a second polysilicon layer 123, and a first metal layer 122 located between the first polysilicon layer 121 and the second polysilicon layer 123. The polysilicon layers are thin, and in the process of etching the contact area between their sides and the etching gas is small and the etching time is short. Therefore, the polysilicon layers can form a relatively straight profile. In addition, since only one first metal layer 122 is provided, the process of the entire first conductive layer 120 is relatively simple, and the addition of a metal layer has little impact on the electrical performance of the gate structure 150, whereby the gate structure 150 can easily meet the requirements of a semiconductor structure by modulating the concentration of doped ions in the first polysilicon layer 121 and the second polysilicon layer 123.

Figure 4:
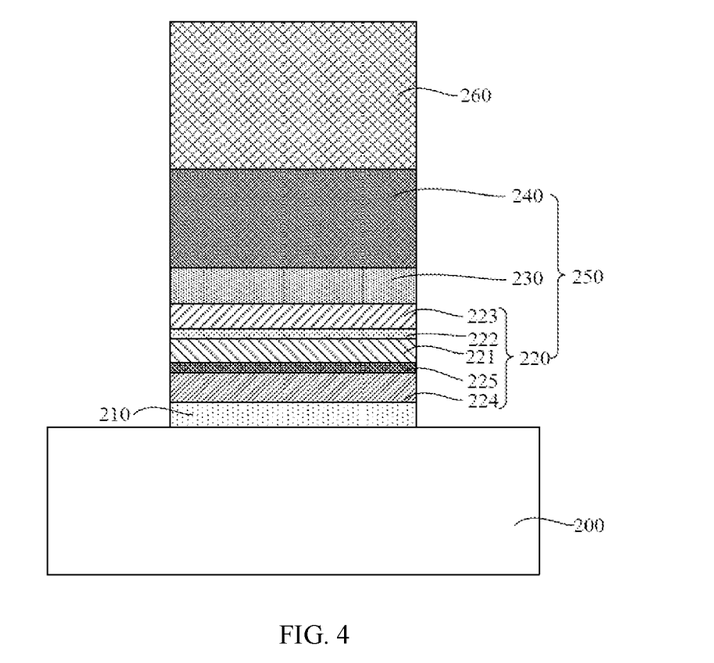
FIG. 4 is a schematic illustration of the semiconductor structure provided by the second embodiment of the present disclosure.

The second embodiment of the present disclosure provides a semiconductor structure. The present embodiment and the first embodiment are essentially the same, and FIG. 4 is a schematic illustration of the semiconductor structure provided in the present embodiment. Referring to FIG. 4, the semiconductor structure comprises a gate dielectric layer 210 on a substrate 200, a gate structure 250 and an insulating cap layer 260, wherein the gate structure 250 comprises a first conductive layer 220, a barrier layer 230, and a second conductive layer 240 which are stacked in sequence, and the first conductive layer 220 comprises a first polysilicon layer 221, a second polysilicon layer 223 and a first metal layer 222. The present embodiment differs from the first embodiment mainly in that: in the present embodiment, the first conductive layer 220 also comprises a third polysilicon layer 224 and a second metal layer 225 which are stacked in sequence, wherein the third polysilicon layer 224 is adjacent to the substrate 200 and the second metal layer 225 is located between the third polysilicon layer 224 and the first polysilicon layer 221.

The identicalness and similarity of the present embodiment to the first embodiment will be referenced in the first embodiment and will not be repeated herein.

The present embodiment will be described in detail below with reference to the accompanying drawings.

Referring to FIG. 4, in some embodiments, the first conductive layer 220 comprises a third polysilicon layer 224, a second metal layer 225, a first polysilicon layer 221, a first metal layer 222, and a second polysilicon layer 223 which are stacked in sequence, that is, three polysilicon layers separated by two metal layers.

The total thickness of the first conductive layer 220 is from 23 nm to 50 nm, specifically 25 nm, 30 nm, or 40 nm.

The first polysilicon layer 221, the second polysilicon layer 223, and the third polysilicon layer 224 have the same thickness, which is 6 nm to 10 nm and which specifically may be 7 nm, 8 nm, or 9 nm.

P-type ions or N-type ions are doped in the first polysilicon layer 221, the second polysilicon layer 223 and the third polysilicon layer 224.

In some embodiments, the concentrations of doped ions in the first polysilicon layer 221, the second polysilicon layer 223, and the third polysilicon layer 224 are different, whereby the work function of the first conductive layer 220 can be modulated more flexibly. In other exemplary embodiments, the above three layers may have the same concentration of doped ions.

The first metal layer 223 and the second metal layer 225 have the same material and thickness, wherein the thickness is from 0.5 nm to 1 nm and may specifically be 0.6 nm, 0.8 nm, or 0.9 nm. This ensures that the first metal layer 223 and the second metal layer 225 have the same impact on the gate structure 150, and it will be easier to modulate the electrical performance of the gate structure 250 by changing the ion concentrations in the first polysilicon layer 221, the second polysilicon layer 223 and the third polysilicon layer 224.

Compared with the first embodiment, in the present embodiment, the number of polysilicon layers is further increased and the thickness of each polysilicon layer is further reduced. Therefore, the contact area between the sides of a polysilicon layer and the etching gas is further reduced and the etching time is reduced, thereby ensuring that the sides of a polysilicon layer have a straight profile.

In other exemplary embodiments, the number of polysilicon layers may be four or more; and the number of metal layers may be three or more.

To sum up, in the present embodiment, without changing the total thickness of the first conductive layer 220, an increase in the number of the third polysilicon layers 224 can further reduce the thickness of each polysilicon layer and lessen the etching degree of the sides of each polysilicon layer by the etching gas, thereby keeping the sides of a polysilicon layer in a relatively straight profile.

Figure 5:
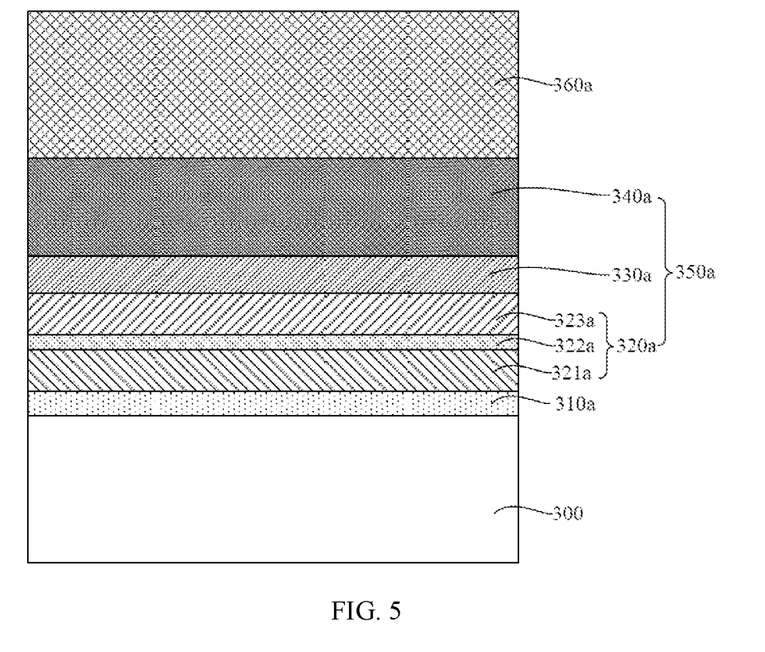
FIG. 5 is a first schematic illustration corresponding to a step in the manufacturing method of the semiconductor structure provided by the third embodiment of the present disclosure.
Figure 6:
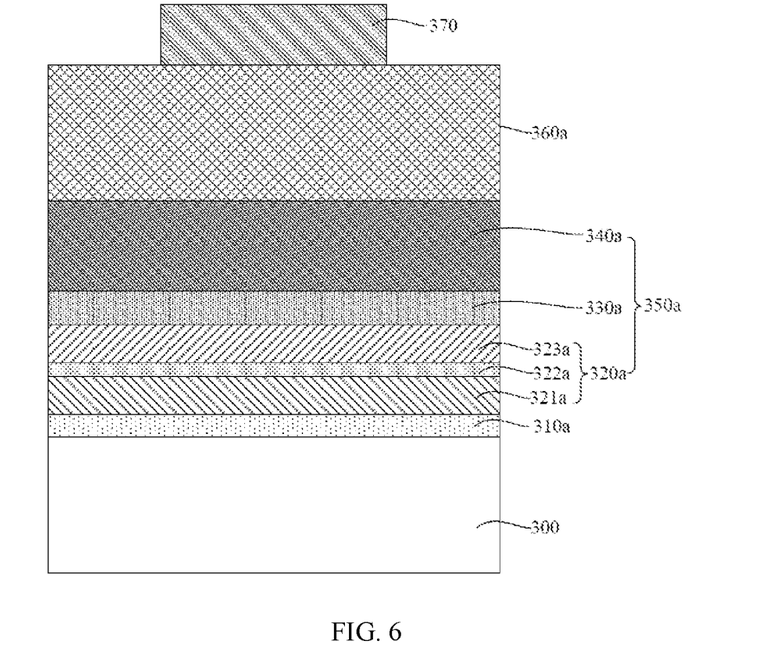
FIG. 6 is a second schematic illustration corresponding to a step in the manufacturing method of the semiconductor structure provided by the third embodiment of the present disclosure.
Figure 7:
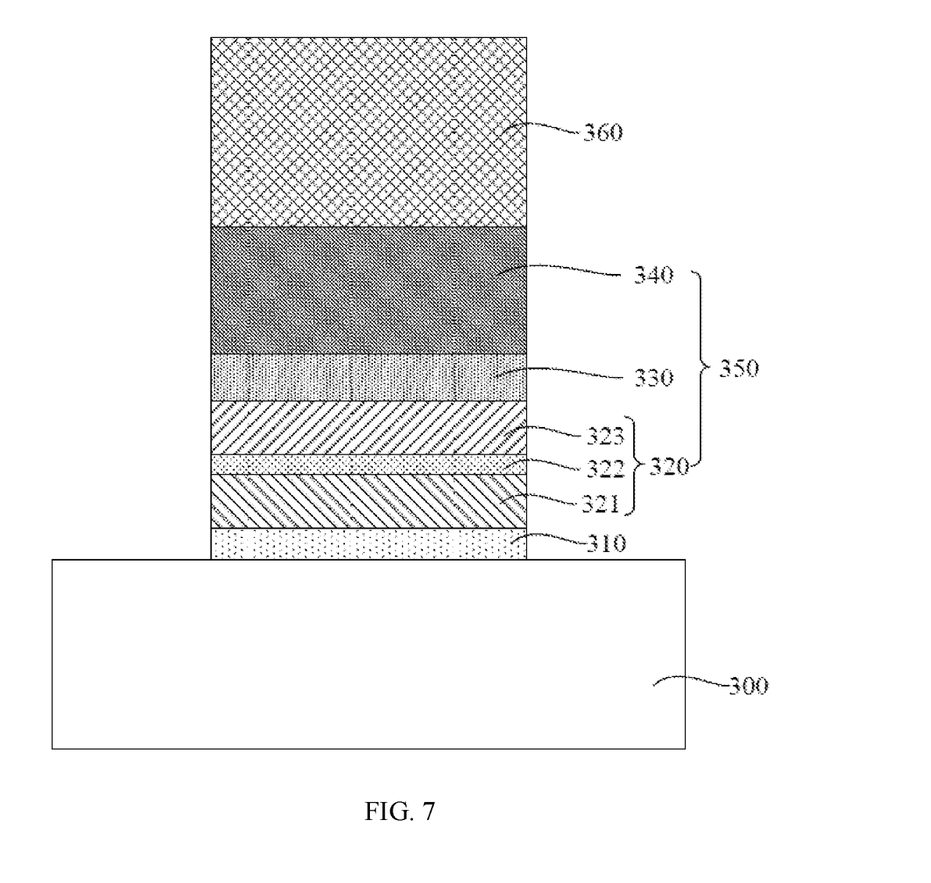
FIG. 7 is a third schematic illustration corresponding to a step in the manufacturing method of the semiconductor structure provided by the third embodiment of the present disclosure.

The third embodiment of the application provides a manufacturing method of a semiconductor structure. The manufacturing method provided thereby can be used to manufacture the semiconductor structures in the first embodiment and the second embodiment. FIGS. 5-7 are schematic illustrations corresponding to each step in the manufacturing method of the semiconductor structure provided by the present embodiment.

The present embodiment will be described in detail below with reference to the accompanying drawings.

Referring to FIG. 5, providing a substrate 300 on which an initial first conductive layer 320a, an initial barrier layer 330a, and an initial second conductive layer 340a are sequentially formed, wherein the initial first conductive layer 320a, the initial barrier layer 330a, and the initial second conductive layer 340a constitute an initial gate structure 350a; the initial first conductive layer 320a, comprising an initial first polysilicon layer 321a, an initial first metal layer 322a, and an initial second polysilicon layer 323a, with the initial first polysilicon layer 321a adjacent to the substrate 300 and the initial second polysilicon layer 323a contiguous to the initial barrier layer 330a; and the initial first metal layer 322a, located between the initial first polysilicon layer 321a and the initial second polysilicon layer 323a.

The formation of the initial gate structure 350a will be described in detail below:

In some embodiments, the initial first conductive layer 320a comprises a first initial polysilicon layer 321a, a second initial polysilicon layer 323a and a first metal layer 322a. That is, the initial first conductive layer 320a comprises two initial polysilicon layers and one initial metal layer. It will be understood that in other exemplary embodiments the initial first conductive layer may also comprise three or more initial polysilicon layers and two or more first gate metal layers.

In some embodiments, the initial first polysilicon layer 321a is formed by a chemical vapor deposition process (CVD), which has a faster deposition rate and facilitates increased productivity.

After the initial first polysilicon layer 321a is formed, ion implantation is performed on the initial first polysilicon layer 321a to modulate the work function of the initial polysilicon 321a and furthermore to adjust the threshold voltage of the entire gate structure 350a formed subsequently, thereby improving the electrical performance of the gate structure 350a. The ions to be implanted comprise boron, phosphorus or gallium.

In other exemplary embodiments, an in-situ doped initial first polysilicon layer may directly be formed by a CVD process and subsequently be annealed.

An initial first metal layer 322a is formed on the initial first polysilicon layer 321a. In the exemplary embodiment, the initial first gate metal layer 322a is formed by an atomic layer deposition process. An atomic layer deposition (ALD) process is a method of depositing the material layer by layer on the surface of the material in the form of monatomic film. In an ALD process, the chemical reaction of the newly formed atomic film is related to the previous one, wherein only one layer of atoms is deposited in each reaction. Accordingly, the film formed by an ALD process has better uniformity. Since the initial first metal layer 322a is relatively thin, an ALD process can improve the film uniformity of the initial first metal layer 322a.

An initial second polysilicon layer 323a is formed on the initial first metal layer 322a and then doped with ions.

The initial first polysilicon layer 321a, the initial second polysilicon layer 323a and the initial first metal layer 322a constitute an initial first conductive layer 320a.

An initial barrier layer 330a is formed on the initial first conductive layer 320a. In the exemplary embodiment, the initial barrier layer 330a is formed by an ALD process. In other exemplary embodiments, the initial barrier layer may be formed by a CVD process.

An initial second conductive layer 340a is formed on the initial barrier layer 330a. In the exemplary embodiment, the initial second conductive layer 340a is formed by a CVD process. In other exemplary embodiments, the initial second conductive layer may be formed by a physical vapor deposition (PVL) process or an ALD process.

In some embodiments, prior to the formation of the initial gate structure 350a, the following step is also comprised: forming an initial gate dielectric layer 310a on the substrate 300, wherein the initial gate structure 350a is located on the initial gate dielectric layer 310a. In the exemplary embodiment, an initial gate dielectric layer 310a is formed by an ALD process.

After the initial gate structure 350a is formed, the following step is also comprised: forming an initial insulating cap layer 360a on the initial gate structure 350a. In the exemplary embodiment, the initial insulating cap layer 360a is formed by a CVD process.

Referring to FIG. 6, a patterned mask layer 370 is formed on the initial gate structure 350a.

In some embodiments, the patterned mask layer 370 is also located on the initial insulating cap layer 360a.

The steps of forming the patterned mask layer 370 comprise: forming a hard mask layer on the initial insulating cap layer 360a, forming a layer of photoresist on the hard mask layer, exposing the photoresist to form a patterned photoresist, and etching the hard mask layer using the patterned photoresist as a mask to form the patterned mask layer 370.

In other exemplary embodiments, the initial insulating cap layer, the initial gate structure, and the initial gate dielectric layer may be directly etched using the patterned photoresist layer as a mask without forming a hard mask layer; and alternatively, a patterned mask layer may be formed by a Self-aligned Double Patterning (SADP) process.

Referring to FIG. 7, the initial insulating cap layer 360a (refer to FIG. 6), the initial gate structure 350a (refer to FIG. 6), and the initial gate dielectric layer 310a (refer to FIG. 6) are etched with the patterned mask layer 370 (refer to FIG. 6) as a mask to form an insulating cap layer 360, a gate structure 350, and a gate dielectric layer 310. The gate structure 350 comprises a first conductive layer 320, a barrier layer 330 and a second conductive layer 340. The first conductive layer 320 comprises a first polysilicon layer 321, a second polysilicon layer 323, and a first metal layer 322 located therebetween. The first conductive layer 320 has upright topographic sides, whereby the gate structure 350 will maintain an excellent electrical performance and the process window for the subsequent formation of a Lightly Doped Drain (LDD) structure will not be affected.

In some embodiments, the etching process is dry etching. A dry etching process is a technique of etching thin films with plasma. When gas exists in the form of plasma, it has two features: on the one hand, the chemical activity of the gas in plasma is much stronger than that in the normal state, and with the gas appropriately chosen according to the different etched materials, the material can react faster with the gas and be removed by the etching process; on the other hand, the electric field may also be used to guide and accelerate the plasma to provide it with certain energy, and when the plasma bombards the surface of the etched material, it will hit the atoms out of the etched material, thereby completing the etching objective by transferring the physical energy.

When etching the initial insulating cap layer 360a, the initial gate structure 350a and the initial gate dielectric layer 310a, the etching gas of each layer varies according to the different materials. Specifically, the material of the initial insulating cap layer 360a may comprise silicon nitride, and the etching gas is carbon tetrafluoride; the material of the initial second conductive layer 340a (refer to FIG. 6) may be tungsten, and the etching gases is carbon chloride; the etching gas of the initial first polysilicon layer 321a (refer to FIG. 6) and the initial second polysilicon layer 323a (refer to FIG. 6) are chlorine; the material of the initial first metal layer 322a (refer to FIG. 6) may be titanium nitride, and the etching gas is boron trichloride and argon; and the material of the initial gate dielectric layer 310a may be silicon dioxide and the etching gas is trifluoromethane, octafluoropropane or carbon tetrafluoride.

First of all, the etching gas of the initial insulating cap layer 360a is filled into the chamber. After the etching is completed, the etching gas is discharged, and then the etching gas of the initial second conductive layer 340a is filled in. That is, after the etching of each layer structure is completed, the etching gas thereof will be discharged, and then the etching gas of the next layer structure will be filled in. It will be understood that if the same etching gas may be used for several adjacent layer structures, the adjacent layer structures can be etched simultaneously in the etching gas.

In some embodiments, in the process of etching the initial second polysilicon layer 323a, the etching selection ratio of the initial second polysilicon layer 323a to the initial first metal layer 322a is higher than 100:1; and in the process of etching the initial first metal layer 322a, the etching selection ratio of the initial first metal layer 322a to the initial first polysilicon layer 321a is higher than 10:1. A higher etching selection ratio ensures that the impact on the lower structure by the etching of the upper structure is reduced, therefore ensuring that the ultimately formed first polysilicon layer 321a, second polysilicon layer 323a and first metal layer 322a can have a relatively straight profile.

To sum up, in the present embodiment, by increasing the number of initial polysilicon layers, the thickness of each initial polysilicon layer is reduced, ensuring that the etching degree of its sides by the etching gas is lessened in the etching process so that the ultimately formed polysilicon layer has a straight profile and the quality of the entire gate structure 350 is improved.

It will be apparent to one of ordinary skill in the art that the above-described embodiments are specific embodiments to implement the present disclosure and that in practical application various revisions in form and detail may be made thereto without departing from the spirit and scope of the present disclosure. Any person skilled in the art may make their own revisions and modifications without departing from the spirit and scope of the present disclosure, so the scope of protection of the present disclosure shall be subject to the scope defined by the claims.

What is claimed is:

1. A semiconductor structure comprising:
a substrate; and
a gate structure located on the substrate, wherein the gate structure comprises a first conductive layer, a barrier layer and a second conductive layer which are stacked in sequence;
wherein the first conductive layer comprises at least two polysilicon layers, and at least one metal layer, wherein a bottom layer of the at least two polysilicon layers is adjacent to the substrate, and a top layer of the at least two polysilicon layers is contiguous to the barrier layer; and adjacent polysilicon layers are provided with one metal layer; and
the first conductive layer has a total thickness of 23 nm to 50 nm;
each polysilicon layer has a same thickness and has a thickness of 9 nm to 15 nm, and each metal layer has a same thickness, and a thickness of each metal layer is from 0.5 nm to 1.5 nm.

2. The semiconductor structure of claim 1, further comprising a gate dielectric layer located between the gate structure and the substrate.

3. The semiconductor structure of claim 1, wherein a material of the first metal layer comprises titanium nitride or tantalum nitride.

4. The semiconductor structure of claim 1, further comprising an insulating cap layer on the gate structure.

5. The semiconductor structure of claim 1, wherein
the first conductive layer comprises a first polysilicon layer, a second polysilicon layer and a first metal layer located between the first polysilicon layer and the second polysilicon layer; and
the first polysilicon layer and the second polysilicon layer are doped with P-type ions or N-type ions.

6. The semiconductor structure of claim 5, wherein a concentration of doped ions in the first polysilicon layer differs from that in the second polysilicon layer.

7. The semiconductor structure of claim 1, wherein the first conductive layer further comprises a third polysilicon layer, a second metal layer, a first polysilicon layer, a first metal layer, and a second polysilicon layer which are sequentially stacked, wherein the third polysilicon layer is adjacent to the substrate, and the second metal layer is located between the third polysilicon layer and the first polysilicon layer.

8. The semiconductor structure of claim 7, wherein the first metal layer and the second metal layer have the same materials and thickness.

9. The semiconductor structure of claim 1, wherein the barrier layer has a thickness of 5 nm to 10 nm.

10. The semiconductor structure of claim 1, wherein the second conductive layer has a thickness of 20 nm to 40 nm.

11. A manufacturing method of a semiconductor structure, comprising:
providing a substrate;
sequentially forming on the substrate an initial first conductive layer, an initial barrier layer and an initial second conductive layer, which in turn constitute an initial gate structure; wherein the initial first conductive layer comprises at least two initial first polysilicon layers, at least one initial metal layer, with a bottom layer of the at least two initial first polysilicon layers located adjacent to the substrate and a top layer of the at least two initial second polysilicon layers located contiguous to the initial barrier layer; and wherein adjacent initial polysilicon layers are provided with one initial metal layer;
forming a patterned mask layer on the initial gate structure; and
etching the initial first conductive layer, the initial barrier layer and the initial second conductive layer with the patterned mask layer as a mask to form a first conductive layer, a barrier layer and a second conductive layer; wherein the first conductive layer, the barrier layer and the second conductive layer constitute a gate structure; and the first conductive layer comprises at least two polysilicon layers, and at least one metal layer;
the first conductive layer has a total thickness of 23 nm to 50 nm;
each polysilicon layer has a same thickness and has a thickness of 9 nm to 15 nm, and each metal layer has a same thickness, and a thickness of each metal layer is from 0.5 nm to 1.5 nm.

12. The manufacturing method of claim 11, wherein the first metal layer is formed by an atomic layer deposition process.

13. The manufacturing method of claim 11, wherein
the first conductive layer comprises a first polysilicon layer, a second polysilicon layer and a first metal layer located between the first polysilicon layer and the second polysilicon layer; and
in a process of etching the initial second polysilicon layer, an etching selection ratio of the initial second polysilicon layer to the initial first metal layer is higher than 100:1; and in the process of etching the initial first metal layer, an etching selection ratio of the initial first metal layer to the initial first polysilicon layer is higher than 10:1.

14. The manufacturing method of claim 11, wherein before the initial gate structure is formed, the method further comprises:
forming an initial gate dielectric layer on the substrate, wherein the initial gate structure is located on the initial gate dielectric layer; and
after the initial gate structure is formed, the method further comprises: forming an initial insulating cap layer which covers the initial gate structure.

15. The manufacturing method of claim 14, wherein after the patterned mask layer is formed, the method further comprises: etching the initial insulating cap layer and the initial gate dielectric layer with the patterned mask layer as a mask to form an insulating cap layer and a gate dielectric layer.

16. The manufacturing method of claim 15, wherein,
an etching gas of the initial insulating cap layer is filled into the chamber, and is discharged after completion of a first etching;
another etching gas of the initial second conductive layer is filled into the chamber, and is discharged after completion of a second etching; and
the first etching and the second etching are iterated until the initial barrier layer, the initial first conductive layer and initial gate dielectric layer are all etched.

17. The manufacturing method of claim 11, wherein after each initial polysilicon layer is formed, ion implantation is performed on the each initial polysilicon layer.

* * * * *